US010552550B2

(12) United States Patent
 Anderson et al.

(10) Patent No.: US 10,552,550 B2
(45) Date of Patent: Feb. 4, 2020

(54) TECHNOLOGIES FOR PHYSICAL PROGRAMMING

(71) Applicant: Intel Corporation, Santa Clara, CA (US)

(72) Inventors: Glen J. Anderson, Beaverton, OR (US); Kevin W. Bross, Tigard, OR (US); Shawn S. Mceuen, Portland, OR (US); Mark R. Francis, Portland, OR (US); Yevgeniy Y. Yarmosh, Portland, OR (US); Blanka Vlasak, Beaverton, OR (US); Gregory A. Peek, Northplains, OR (US); Therese E. Dugan, Sunnyvale, CA (US); Cory A. Harris, Santa Clara, CA (US); Ravishankar Iyer, Portland, OR (US); Omesh Tickoo, Portland, OR (US); David I. Poisner, Carmichael, CA (US)

(73) Assignee: Intel Corporation, Santa Clara, CA (US)

( * ) Notice: Subject to any disclaimer, the term of this patent is extended or adjusted under 35 U.S.C. 154(b) by 908 days.

(21) Appl. No.: 14/866,897

(22) Filed: Sep. 26, 2015

(65) Prior Publication Data
 US 2017/0091346 A1  Mar. 30, 2017

(51) Int. Cl.
 *G06F 17/50* (2006.01)
 *G06F 8/30* (2018.01)
(52) U.S. Cl.
 CPC ............ *G06F 17/50* (2013.01); *G06F 8/30* (2013.01)
(58) Field of Classification Search
 CPC ................... G06F 17/50; G06F 8/30

USPC ........................................................... 703/1
 See application file for complete search history.

(56) References Cited

U.S. PATENT DOCUMENTS

| 6,545,673 | B1 | 4/2003 | Shintani et al. |
| 6,690,396 | B1 | 2/2004 | Anderson |
| 6,741,245 | B1 | 5/2004 | Marks |
| 10,275,222 | B2 * | 4/2019 | Anderson ............... G06F 8/24 |
| 2002/0107674 | A1 | 8/2002 | Bascle et al. |
| 2002/0107679 | A1 | 8/2002 | Roelofs |

(Continued)

FOREIGN PATENT DOCUMENTS

| CN | 1657884 A | 8/2005 |
| CN | 1825915 A | 8/2006 |

(Continued)

OTHER PUBLICATIONS

Timothy Scott McNereny, "Tangible Programming Bricks: An approach to making programming accessible to everyone" Massachusetts Institute of Technology, 1999. Published Feb. 2000, 86 pages.*

(Continued)

*Primary Examiner* — Dwin M Craig
(74) *Attorney, Agent, or Firm* — Barnes & Thornburg LLP

(57) ABSTRACT

Technologies for physical programming include a model compute system to determine one or more physical blocks assembled in a constructed model. The model compute system determines rules associated with the one or more physical blocks in which at least one rule defines a behavior of the constructed model and determines a program stack for execution by the model compute system based on the rules associated with the one or more physical blocks.

25 Claims, 6 Drawing Sheets

(56) References Cited

U.S. PATENT DOCUMENTS

| | | | |
|---|---|---|---|
| 2002/0196250 A1 | 12/2002 | Anderson et al. | |
| 2005/0026537 A1* | 2/2005 | Hsieh | A63H 33/08 |
| | | | 446/330 |
| 2005/0280534 A1 | 12/2005 | Navarro | |
| 2006/0106815 A1* | 5/2006 | Timcenko | G05B 19/4099 |
| 2006/0188132 A1 | 8/2006 | Shigeta | |
| 2007/0063997 A1 | 3/2007 | Scherer | |
| 2007/0203971 A1 | 8/2007 | Walker et al. | |
| 2009/0179734 A1 | 7/2009 | Do et al. | |
| 2010/0277723 A1 | 11/2010 | Rezac et al. | |
| 2011/0298922 A1 | 12/2011 | Horovitz | |
| 2014/0378022 A1 | 12/2014 | Muthyala | |

FOREIGN PATENT DOCUMENTS

| | | |
|---|---|---|
| CN | 1970894 A | 5/2007 |
| CN | 101482879 A | 7/2009 |
| EP | 1271415 A1 | 4/2002 |
| EP | 2202608 A1 | 6/2010 |
| JP | H3-138758 A | 6/1991 |
| JP | 2000-259855 A | 9/2000 |
| JP | 2000306122 A | 11/2000 |
| JP | 2003-132373 A | 5/2003 |
| JP | 2004519034 A | 6/2004 |
| JP | 2004326384 A | 11/2004 |
| WO | 2012160055 A1 | 11/2012 |
| WO | 2012160057 A1 | 11/2012 |

OTHER PUBLICATIONS

International Search Report for PCT/US16/048948, dated Dec. 7, 2016 (3 pages).

Written Opinion for PCT/US16/048948, dated Dec. 7, 2016 (9 pages).

Notice of Grant received for Chinese Patent Application No. 200910266821.9, dated Jul. 2, 2013, 6 pages of Chinese Notice of Grant and 2 pages of unofficial English translation.

Office Action received for European Patent Application No. 09252782.9, dated Jan. 18, 20123, 5 pages.

Office Action received for Japanese Patent Application No. 2009-293556, dated Apr. 17, 2012, 1 page of Japanese Office Action and 2 pages of unofficial English summary translation.

Nishida et al., "The surrounding sensor approach—application to sleep apnea syndrome diagnosis based on image processing", Systems, Man, Cybernetics, 1999, IEEE SMC '99 Conference Proceedings, vol. 6, pp. 382-388.

Office Action for European Patent Application No. 09252782.9, dated Feb. 20, 2014, 5 pages.

Office Action received for Japanese Patent Application No. 2013-021811, dated Dec. 24, 2013, 2 pages of Japanese Office Action and 2 pages of unofficial English translation.

Office Action received for Chinese Patent Application No. 200910266821.9, dated Feb. 5, 2013, 3 pages of Chinese Office Action and 5 pages of unofficial English translation.

Decision to Grant received for Japanese Patent Application No. 2009-293556, dated Dec. 11, 2012, 1 page of Japanese Decision to Grant and 1 page of partial, unofficial English translation.

Office Action for European Patent Application No. 09252782.9, dated Oct. 26, 2012, 7 pages.

Office Action received for Chinese Patent Application No. 200910266821.9, dated Jun. 5, 2012, 8 pages of Chinese Office Action, including 5 pages of unofficial English translation.

Office Action received for Chinese Patent Application No. 200910266821.9, dated Aug. 24, 2011, 3 pages of Chinese Office Action and 6 pages of unofficial English translation.

Office Action received for Korean Patent Application No. 10-2009-130141, dated Mar. 18, 2011, 4 pages of Korean Office Action and 3 pages of unofficial English translation.

European Search Report received for European Patent Application No. 09252782.9, dated May 4, 2010, 4 pages.

Office Action received for European Patent Application No. 09252782.9, dated May 31, 2010, 4 pages.

Anderson et al., "Tangible interaction + Graphical Interpretation: A New Approach to 3D Modeling", XP-001003579, Computer Graphics, Proceeding Annual Conference Series, Jul. 2000, pp. 393-402.

Anderson et al., "Building Virtual Structures With Physical Blocks", XP-001113175, Proceedings of the 12th Annual ACM Symposium on User Interface Software & Technology, vol. 1, Nov. 7, 1999, pp. 71-72.

Gorbet et sal., "Triangles: Tangible interface for manipulation and exploration of digital information topography", XP-000780774, Proceeding of SIGCHI Conference on Human Factors in Computer Systems, 19998, pp. 49-56.

* cited by examiner

TECHNOLOGIES FOR PHYSICAL PROGRAMMING

BACKGROUND

Construction block kits are often used to assemble a wide variety of models and objects. For example, some kits permit the construction of vehicles, characters, and buildings from popular television shows or movies and/or the creation of other well-known objects. In some embodiments, some of the construction blocks allow input and output functions such as making sounds and/or activating lights in response to the user depressing a particular button on the assembled model. Additionally, in some systems, assembled models may be photographed and reproduced in a virtual world (e.g., in a video game).

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
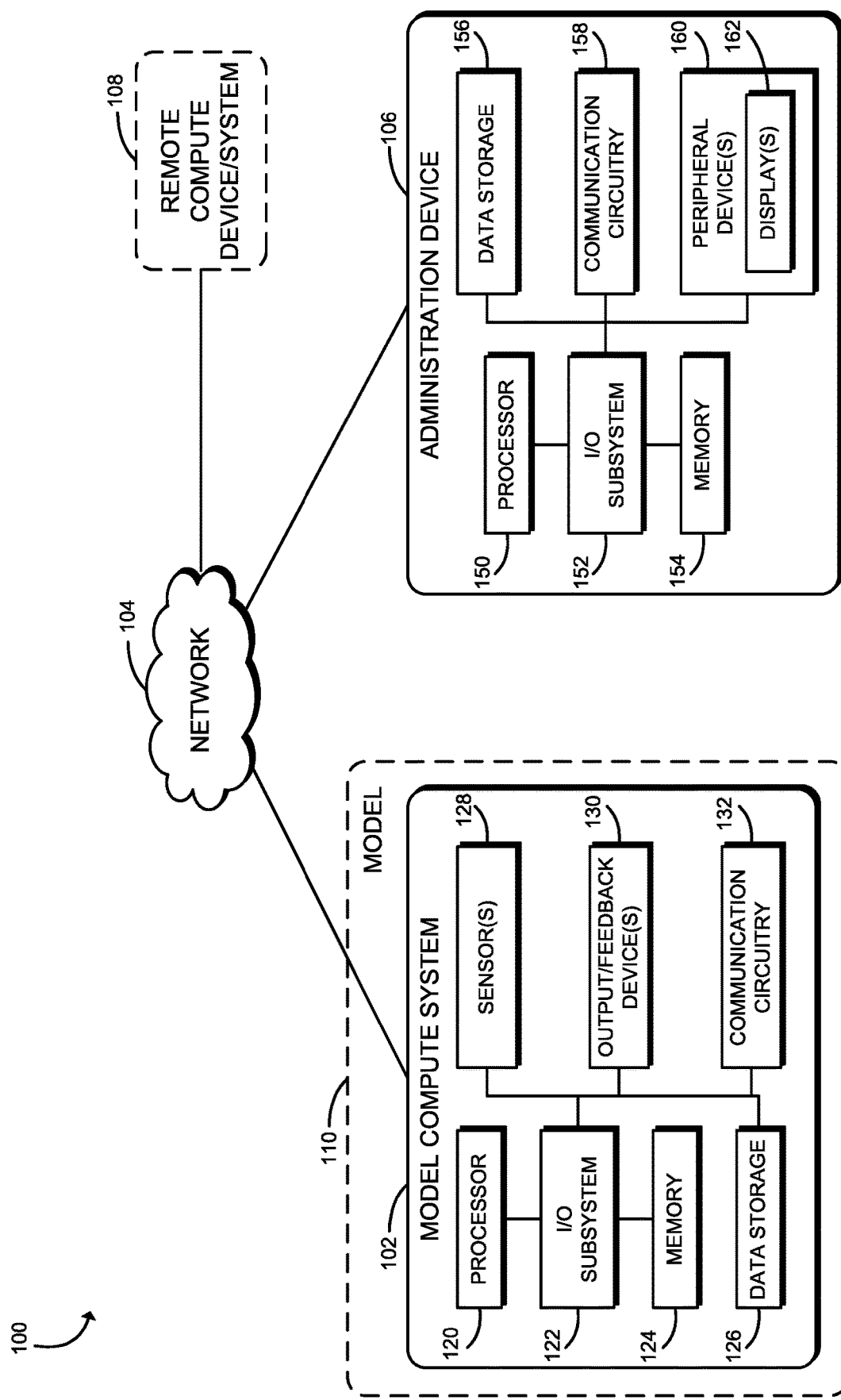
FIG. 1 is a simplified block diagram of at least one embodiment of a system for physical programming.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); (A and C); or (A, B, and C). Similarly, items listed in the form of "at least one of A, B, or C" can mean (A); (B); (C): (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a system 100 for physical programming includes a model compute system 102 (i.e., a compute system of a physical model), a network 104, and an administration device 106. Additionally, in some embodiments, the system 100 may include a remote compute device or system 108. Although only one model compute system 102, one network 104, one administration device 106, and one remote compute device 108 are illustratively shown in FIG. 1, the system 100 may include any number of model compute systems 102, networks 104, administration devices 106, and/or remote compute devices/systems 108 in other embodiments.

Figure 6:
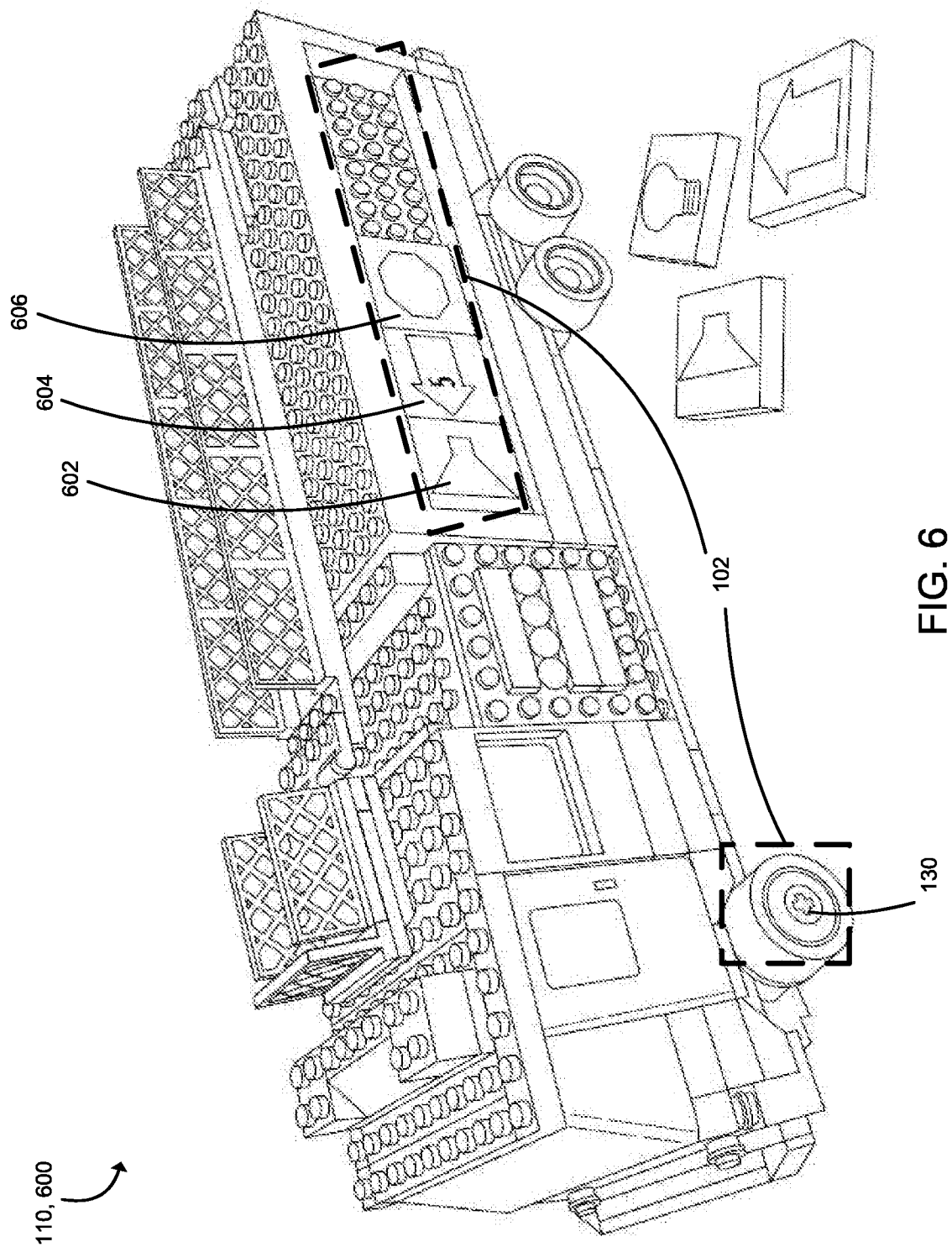
FIG. 6 is a simplified diagram of at least one embodiment of a constructed model of the system of FIG. 1.

As shown in FIG. 1, the model compute system 102 is included in a physical model 110, which may be assembled by a user from a plurality of physical construction blocks. That is, a user (e.g., a child, parent, instructor, or other user) may assemble a plurality of physical construction blocks into an embodiment of the model 110 as shown in FIG. 6. Of course, at the particular stage of construction, the model 110 may be partially assembled or fully assembled. Further, the particular construction blocks used may be embodied in any physical form factor, may be any geometric shape, and may be constructed from any material suitable for performing the functions described herein and may vary depending on the particular embodiment. In some embodiments, the construction blocks may be embodied as toy construction blocks (e.g., similar in shape/style to toy construction blocks manufactured as Lego® components) that may be secured to one another in various configurations (e.g., to construct a larger object). In other embodiments, one or more of the construction blocks may be embodied, for example, as hats, rings, shoes, figurines, signs, and/or other physical objects. For example, in some embodiments, the construction blocks may be embodied as various clothes, accessories, and/or other accoutrements of a toy doll/soldier.

As described in greater detail below, in some embodiments, the constructed model 110 may include a set of "smart," "action," "function," or "behavior" blocks that may affect the behavior of the model and/or a set of standard or "dumb" construction blocks that do not affect the behavior of the constructed model 110. Additionally, some of the construction blocks may include output components such as, for example, a motorized axle, speakers, tactile feedback components, and/or other suitable features (e.g., output devices 130). Further, the construction blocks may include sensors 128 (i.e., input devices) in some embodiments. As such, it should be appreciated that, in some embodiments, one or more of the construction blocks may, individually or collectively, include the model compute system 102. That is, in some embodiments, the model compute system 102 may form a portion of (i.e., be distributed across) one or more of the physical blocks of the model 110. In other embodiments, the model compute system 102 may be separate from the model 110 (see, for example, FIG. 6) but capable of identifying the blocks assembled to form the constructed model 110 and/or otherwise perform the functions described herein.

As described in detail below, in the illustrative embodiment, the model compute system 102 is configured to determine which physical construction blocks are assembled in a constructed model at a given point in time (e.g., periodically, continuously, etc.). The model compute system 102 may determine the rule(s), if any, associated with each of the physical blocks of the model. As described below, the rules define particular behaviors (e.g., actions, functions, correlations, parameters, etc.) of the constructed model and may vary depending on various factors. For example, a particular physical block may be indicative of one behavior under certain circumstances and another behavior under other circumstances. The model compute system 102 may determine a program stack for execution by the model compute system 102 based on the rules associated with the one or more physical blocks in the constructed model. Further, in some embodiments, the administration device 106 may generate and display a visual representation of the program stack and/or the constructed model on a graphical user interface as described below.

The model compute system 102 may be embodied as any type of computing system or device capable of performing the functions described herein. For example, in some embodiments, the model compute system 102 may be embodied as a microcontroller or other electronic control system. In other embodiments, the model compute system 102 may instead be embodied as a standalone computing device or computing system. For example, in some embodiments, the model compute system 102 may be embodied as a smartphone, cellular phone, wearable computing device, smart watch, smart glasses, implanted/implantable computing device, personal digital assistant, mobile Internet device, tablet computer, netbook, notebook, Ultrabook™, laptop computer, local compute node, and/or any other mobile computing/communication device.

As shown in FIG. 1, the illustrative model compute system 102 includes a processor 120, an input/output ("I/O") subsystem 122, a memory 124, a data storage 126, one or more sensors 128, one or more output/feedback devices 130, and a communication circuitry 132. Of course, the model compute system 102 may include other or additional components, such as those commonly found in a typical computing device (e.g., various input/output devices and/or other components), in other embodiments. Additionally, in some embodiments, one or more of the illustrative components may be incorporated in, or otherwise form a portion of, another component. For example, the memory 124, or portions thereof, may be incorporated in the processor 120 in some embodiments.

The processor 120 may be embodied as any type of processor capable of performing the functions described herein. For example, the processor 120 may be embodied as a single or multi-core processor(s), digital signal processor, microcontroller, or other processor or processing/controlling circuit. Similarly, the memory 124 may be embodied as any type of volatile or non-volatile memory or data storage capable of performing the functions described herein. In operation, the memory 124 may store various data and software used during operation of the model compute system 102 such as operating systems, applications, programs, libraries, and drivers. The memory 124 is communicatively coupled to the processor 120 via the I/O subsystem 122, which may be embodied as circuitry and/or components to facilitate input/output operations with the processor 120, the memory 124, and other components of the model compute system 102. For example, the I/O subsystem 122 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem 122 may form a portion of a system-on-a-chip (SoC) and be incorporated, along with the processor 120, the memory 124, and other components of the model compute system 102, on a single integrated circuit chip (e.g., a microcontroller).

The data storage 126 may be embodied as any type of device or devices configured for short-term or long-term storage of data such as, for example, memory devices and circuits, memory cards, hard disk drives, solid-state drives, or other data storage devices. The data storage 126 and/or the memory 124 may store various data during operation of the model compute system 102 as described herein.

The sensors 128 may be embodied as any one or more sensors configured to generate data/signals indicative of an environment or context of the model compute system 102. In various embodiments, the sensors 128 may be embodied as, or otherwise include, for example, inertial sensors, position sensors, location sensors, proximity sensors, optical sensors, light sensors, audio sensors, temperature sensors, motion sensors, piezoelectric sensors, cameras, and/or other types of sensors. Of course, the model compute system 102 may also include components and/or devices configured to facilitate the use of the sensor(s) 128. Depending on the particular embodiment, the sensors 128 may include hardware sensors and/or software sensors (e.g., software sensors to identify software applications executed at a particular point in time).

The output devices 130 may be embodied as any devices configured to generate feedback to a user of the system 100. For example, the output devices 130 may include one or more speakers, displays, vibration or other tactile feedback generators, lights, and/or other suitable output devices.

The communication circuitry 132 may be embodied as any communication circuit, device, or collection thereof, capable of enabling communications between the model compute system 102 and other remote devices (e.g., the administration device 106 and/or the remote compute device/system 108) over a network (e.g., the network 104). The communication circuitry 132 may be configured to use any one or more communication technologies (e.g., wireless or wired communications) and associated protocols (e.g., Ethernet, Bluetooth®, WiFi®, WiMAX, LTE, 5G, etc.) to effect such communication.

The network 104 may be embodied as any type of communication network capable of facilitating communication between the model compute system 102 and remote devices (e.g., the administration device 106 and/or the remote compute device/system 108). As such, the network 104 may include one or more networks, routers, switches, computers, and/or other intervening devices. For example, each network 104 may be embodied as or otherwise include one or more cellular networks, telephone networks, local or wide area networks, publicly available global networks (e.g., the Internet), an ad hoc network, or any combination thereof.

The administration device 106 may be embodied as any type of computing device capable of performing the functions described herein. For example, in some embodiments, the administration device 106 may be embodied as a desktop computer, laptop computer, tablet computer, notebook, netbook, Ultrabook™, server, and/or any other computing/communication device. As shown in FIG. 1, the illustrative administration device 106 includes a processor 150, an I/O subsystem 152, a memory 154, a data storage 156, a communication circuitry 158, and one or more peripheral devices 160. Each of the processor 150, the I/O subsystem 152, the memory 154, the data storage 156, and the communication circuitry 158 may be similar to the corresponding components of the model compute system 102. As such, the description of those components of the model compute system 102 is equally applicable to the description of those components of the administration device 106 and is not repeated herein for clarity of the description.

The peripheral devices 160 may include any number of additional peripheral or interface devices, such as speakers, microphones, additional storage devices, and so forth. The particular devices included in the peripheral devices 160 may depend on, for example, the type and/or intended use of the administration device 106. As shown in FIG. 1, the peripheral devices 160 include one or more displays 162. Each of the displays 162 of the administration device 106 may be embodied as any type of display on which information may be displayed to a viewer of the administration device 106. Further, each of the displays 162 may be embodied as, or otherwise use any suitable display technology including, for example, a liquid crystal display (LCD), a light emitting diode (LED) display, a cathode ray tube (CRT) display, a plasma display, an image projector (e.g., 2D or 3D), a laser projector, a touchscreen display, and/or other display technology.

The remote compute device/system 108 may be embodied as any type of computing device or system of computing devices capable of performing the functions described herein. For example, in some embodiments, the remote compute device 108 may be embodied as a server, rack-mounted server, blade server, desktop computer, laptop computer, tablet computer, notebook, netbook, Ultrabook™, cellular phone, smartphone, personal digital assistant, mobile Internet device, wearable computing device, Hybrid device, and/or any other computing/communication device. Further, in some embodiments, the remote compute system 108 may be embodied as corresponding model compute system of another model (e.g., a model within the proximity of the model 110 or in communication with the model compute system 102). In other embodiments, the remote compute device/system 108 may be embodied as a cloud server. The remote compute device/system 108 may include components similar to those of the model compute system 102 and/or the administration device 106 discussed above. The description of those components of the model compute system 102 and/or the administration device 106 is equally applicable to the description of components of the remote compute device/system 108 and is not repeated herein for clarity of the description. Further, it should be appreciated that the remote compute device/system 108 may include other components, sub-components, and devices commonly found in a computing system, which are not discussed above for clarity of the description. In some embodiments, one or more of the components of the model compute system 102 and/or the administration device 106 may be omitted from the remote compute device/system 108.

Figure 2:
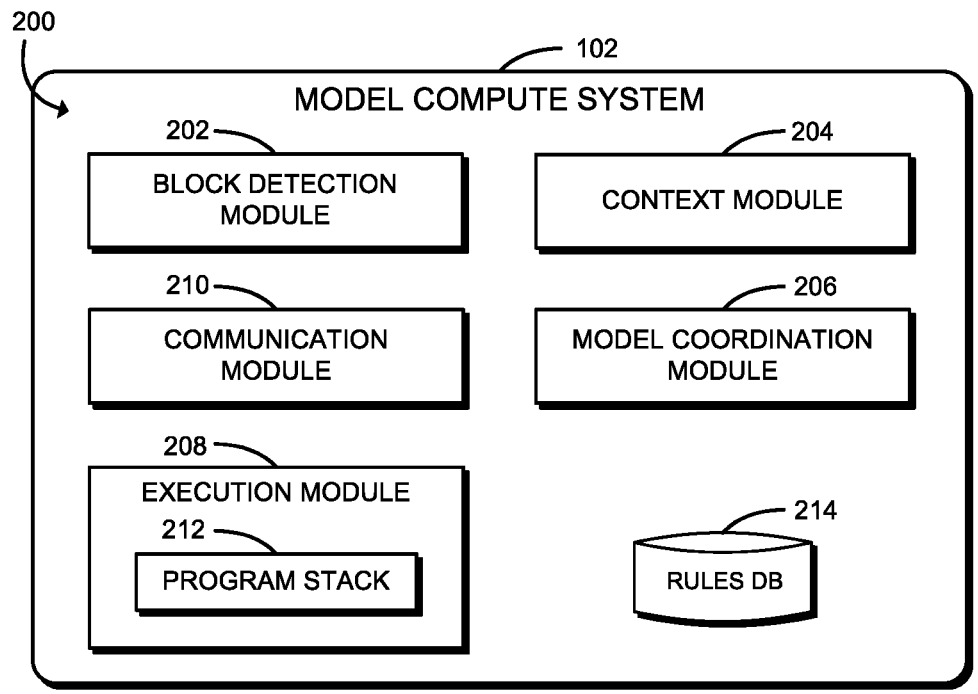
FIG. 2 is a simplified block diagram of at least one embodiment of an environment of a model compute system of the system of FIG. 1.

Referring now to FIG. 2, in use, the model compute system 102 establishes an environment 200 for physical programming. The illustrative environment 200 includes a block detection module 202, a context module 204, a model coordination module 206, an execution module 208, and a communication module 210. The various modules of the environment 200 may be embodied as hardware, software, firmware, or a combination thereof. For example, the various modules, logic, and other components of the environment 200 may form a portion of, or otherwise be established by, the processor 120 or other hardware components of the model compute system 102. As such, in some embodiments, one or more of the modules of the environment 200 may be embodied as circuitry or collection of electrical devices (e.g., a block detection circuitry 202, a context circuitry 204, a model coordination circuitry 206, an execution circuitry 208, and/or a communication circuitry 210). It should be appreciated that, in such embodiments, one or more of the block detection circuitry 202, the context circuitry 204, the model coordination circuitry 206, the execution circuitry 208, and/or the communication circuitry 210 may form a portion of one or more of the processor 120, the I/O subsystem 122, the memory 124, the data storage 126, the sensors 128, the output devices 130, and/or the communication circuitry 132. Additionally, a portion of each of the circuitries described herein may be located on different blocks of the model 110. For example, in some embodiments, the block detection circuitry 202 may include one or more sub-circuits distributed among multiple physical blocks of the model 110. Additionally, in some embodiments, one or more of the illustrative modules may form a portion of another module and/or one or more of the illustrative modules may be independent of one another.

As described above, a model 110 may be assembled by connecting individual physical blocks to one another. In some embodiments, one or more of the construction blocks may have a unique identifier and/or be otherwise associated with a rule or set of rules (e.g., defined in a rules database 214) that defines a behavior of the constructed model. Further, in some embodiments, the particular behavior of the model may vary depending on the assembled location of the construction block relative to other construction blocks and/or other contextual data regarding the constructed model. Of course, as described above, some of the construction blocks may be embodied as standard or "dumb" construction blocks. For example, in some embodiments, such "dumb" construction blocks may not affect the behavior of the constructed model 110, whereas other "smart," "action," "function," or "behavior" blocks may affect the behavior of the model 110. It should be appreciated, however, that although the "action" blocks may determine, for example, the movements and sounds of a model 110, those blocks are not necessarily the output blocks/parts of the model 110 that actually have a motor, actuator, or other output component to perform the function. Rather, the "action" blocks may dictate the instructions (i.e., the program stack 212) that are executed by the model compute system 102 to effect action by those output components. For example, as shown in FIG. 6, the user may build a fire engine model 600 with powered wheels (i.e., the output components 130) and add a "beep horn" block 602, a "move for five seconds" block 604, and a "stop" block 606 in a particular order to cause the fire engine model 600 to perform the corresponding functions when the resulting program stack 212 is executed by the model compute system 102. Although the blocks 602, 604, 606 are shown as tiles secured to a side of the model 600, it should be appreciated that the blocks 602, 604, 606 may be otherwise formed and/or positioned in another embodiment (e.g., as more integral building blocks of the fire engine model 600).

The block detection module 202 is configured to determine which physical construction blocks are assembled in a constructed (i.e., fully or partially constructed) model 110 at a given point in time (e.g., periodically, continuously, in response to the satisfaction of some condition, etc.). Further, the block detection module 202 may determine the position at which the construction blocks are assembled relative to one another and/or relative to another reference point (e.g., an order in which the construction blocks are secured to one another in a physical stack of blocks, etc.). It should be appreciated that the model compute system 102 may utilize any suitable technique, algorithm, and/or mechanism for doing so. For example, in some embodiments, the block detection module 202 may determine or identify physical connections (e.g., electrical connections, electromechanical connections, electromagnetic connections, etc.) between one or more constructions blocks based on self-reporting of such connections to the block detection module 202. At least one embodiment of determining how construction blocks are assembled relative to one another based on electrical/electromechanical connections between the construction blocks is described in U.S. Patent Application Publication No. 2002/0196250 by Anderson et al. In some embodiments, the block detection module 202 may utilize sensors 128 embedded in the construction blocks and/or located external to the construction blocks (e.g., cameras) to identify the physical blocks and/or determine the position of the blocks relative to one another. At least one embodiment of doing so is described in U.S. Pat. No. 8,754,886 by Wouhaybi et al. It should be appreciated that, in some embodiments, one or more of the construction blocks (e.g., each block) may include or be associated with a particular identifier (e.g., a unique identifier). Further, as described in greater detail below, the positions of the construction blocks relative to one another may affect the behavior of the assembled/constructed model 110. For example, in one embodiment, a first order of a set of blocks may be indicative of a first behavior of the model 110, whereas another order of the same set of blocks may be indicative of a different behavior of the model 110 (e.g., based on rules associated with the corresponding blocks as defined in the rules database 214).

The context module 204 may determine the context of the model compute system 102 based on, for example, sensor data generated by the sensors 128 (e.g., hardware and/or software sensors) and/or other suitable data of the model compute system 102. For example, in some embodiments, the context module 204 may determine characteristics regarding the physical environment of the model 110, the location of the model 110, other compute systems to which the model compute system 102 is communicatively coupled (e.g., other nearby model compute systems within the vicinity of the model 110), the current time, and/or other suitable contextual information.

The model coordination module 206 is configured to determine rules associated with the physical construction blocks in the assembled model 110. As indicated above, each of the blocks may be associated with one or more rules that define behaviors (e.g., actions, functions, correlations, parameters, etc.) of the model 110. Further, it should be appreciated that the rules for a particular construction block may be indicative of one behavior in certain circumstances and another behavior in different circumstances. For example, the behavior may vary depending on the presence of (or lack of) one or more other blocks in the model 110, how the block is positioned relative to other blocks (e.g., whether it is in a particular sequence), whether the behavior is overridden by another block (e.g., a "global" control block), inherited behaviors from other blocks, etc. The model coordination module 206 generates a program stack 212 for execution by the model compute system 102 based on the rules associated with the construction blocks. For example, in some embodiments, the model coordination module 206 may determine a program stack 212 that includes high-level or low-level functions to be performed by the model 110 based on the assembled model and the rules of the corresponding blocks. Of course, in some embodiments, the program stack 212 may include flow control statements (e.g., goto, while, for-next, if-then, switch, and/or other flow control statements), which may associated with a particular construction block or otherwise generated/determined. For example, a particular block may represent a repeat of actions that corresponds with a loop control statement in the program stack 212, thereby causing the model 110 to repeat one or more behaviors a number of times (e.g., a predefined or condition-based number). In some embodiments, the particular behavior(s), number of repeated actions, and/or related conditions may be determined by the particular block or a user edit of the program stack 212. Additionally, one or more of the blocks in the model 110 may be embodied as a "time" block that indicates a particular behavior (e.g., behavior of the "previous" block) is to occur for a certain period of time (e.g., move forward for five seconds), which may be appropriately incorporated in the program stack 212 (e.g., as a function parameter). Further, in some embodiments, one or more blocks may correspond with other functions or subroutines in the program stack 212 that cause the administration device 106 to retrieve a random number to direct the model 110 to operate for a given time period.

The execution module 208 is configured to execute the program stack 212. That is, the execution module 208 is configured to operate the constructed model 110 based on the functions set forth in the program stack 212. It should be appreciated that, depending on the particular embodiment, the execution module 208 may determine to operate the constructed model 110 in response to the occurrence of some action (e.g., in response to the user of the model 110 depressing a particular button), in response to the satisfaction of some condition (e.g., in response to receiving a message from another model 110, in response to determining the model 110 is at a particular location, or in response to other contextual criteria), and/or in another suitable way. Of course, in some embodiments, less than the entirety of the program stack 212 may be executed for a given execution sequence. For example, in an embodiment, the execution module 208 may execute a first set of functions defined in the program stack 212 without executing other functions defined in the program stack 212 (e.g., conditional functions).

The communication module 210 handles the communication between the model compute system 102 and other compute devices of the system 100 (e.g., the administration device 106 and/or remote compute devices 108). For example, as described herein, the model compute system 102 may report model data indicative of the program stack 212 to the administration device 106, which may generate and display a visual representation of the program stack 212 for viewing by the user of the administration device 106 (e.g., the user of the model 110). It should be appreciated that the particular model data transmitted may vary depending on the particular embodiment. For example, in some embodiments, the communication module 210 may transmit the program stack 212 to the administration device 106 whereas, in other embodiments, the communication module 210 may transmit other model data that may be utilized by the administration device 106 to regenerate the program stack 212.

Figure 3:
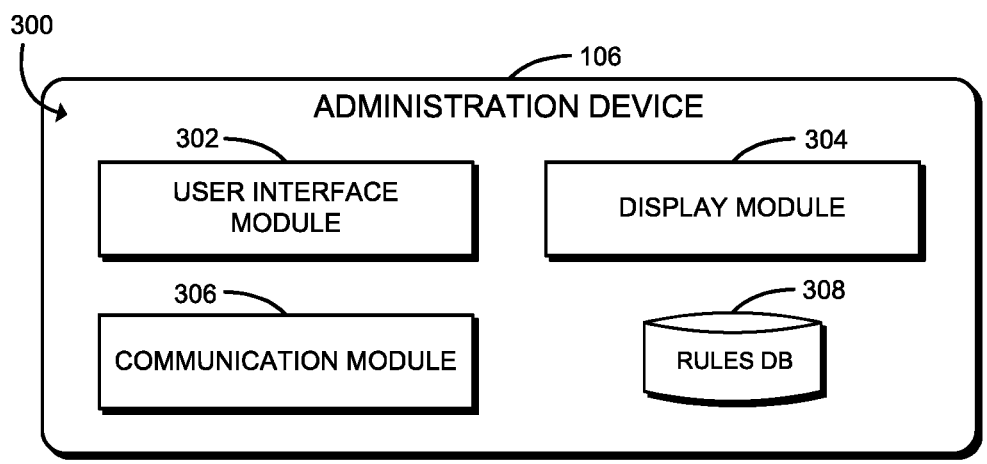
FIG. 3 is a simplified block diagram of at least one embodiment of an environment of an administration device of the system of FIG. 1.

Referring now to FIG. 3, in use, the administration device 106 establishes an environment 300 for visually representing physical programming. The illustrative environment 300 includes a user interface module 302, a display module 304, and a communication module 306. The various modules of the environment 300 may be embodied as hardware, software, firmware, or a combination thereof. For example, the various modules, logic, and other components of the environment 300 may form a portion of, or otherwise be established by, the processor 150 or other hardware components of the administration device 106. As such, in some embodiments, one or more of the modules of the environment 300 may be embodied as circuitry or collection of electrical devices (e.g., a user interface circuitry 302, a display circuitry 304, and/or a communication circuitry 306). It should be appreciated that, in such embodiments, one or more of the user interface circuitry 302, the display circuitry 304, and/or the communication circuitry 306 may form a portion of one or more of the processor 150, the I/O subsystem 152, the memory 154, the data storage 156, the communication circuitry 158, and/or the peripheral devices 160. Additionally, in some embodiments, one or more of the illustrative modules may form a portion of another module and/or one or more of the illustrative modules may be independent of one another.

Figure 7:
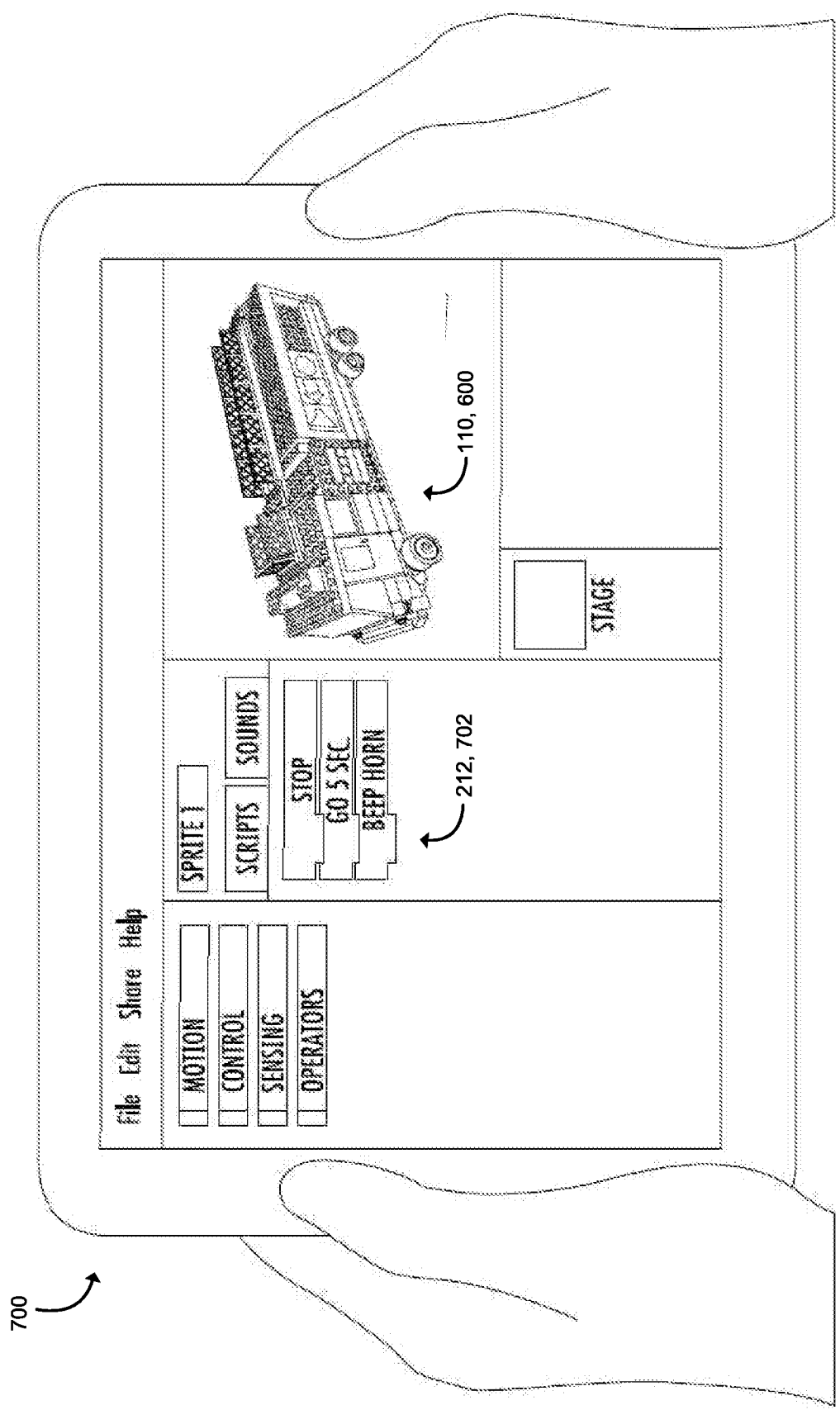
FIG. 7 is a simplified diagram of at least one embodiment of a graphical user interface of the administration device of FIG. 3.

The user interface module 302 is configured to generate a graphical user interface for viewing by the user of the administration device 106 (e.g., the user of the model 110). For example, in the illustrative embodiments, the user interface module 302 generates a visual representation of the program stack 212 (e.g., received from the model compute system 102 or based on other model data received from the model compute system 102) that is to be executed by the model. Further, in some embodiments, the user interface module 302 may generate a visual representation of the constructed model 110. For example, as shown in FIG. 7, the user interface module 302 may generate a graphical user interface 700 for contemporaneous display of a visual representation of the fire engine model 600 and the corresponding program stack 702. In the illustrative embodiment of the graphical user interface 700, the program stack 702 includes functions/instructions corresponding with the "beep horn" block 602, the "move for five seconds" block 604, and the "stop" block 606 as described above.

It should be appreciated that the ability to simultaneously view the constructed model 110 and corresponding program stack 212 may improve the user's understanding of the physical programming associated with the model 110 as constructed. For example, the user may experiment with the relative positioning of physical blocks, the addition/deletion of blocks, and/or other modifications to the constructed model 110 to determine the corresponding physical programming program stack 212. In some embodiments, the user interface module 302 may further permit the user to interact with and/or provide feedback to the administration device 106. For example, in some embodiments, the user may modify the visual representation of the model 110 to effect a change in the corresponding program stack 212. Accordingly, in some embodiments, the administration device 106 may also include a copy of the rules database 214.

The display module 304 is configured to render images on a display 162 of the administration device 106. For example, as discussed above, the display module 304 may display a graphical user interface including a visual representation of the program stack 212 and/or the constructed model 110.

The communication module 306 handles the communication between the administration device 106 and other compute devices of the system 100 (e.g., the model compute system 102 and/or remote compute devices 108). For example, as described above, the administration device 106 may receive model data (e.g., the program stack 212) indicative of a desired behavior of a constructed model 110. Additionally, in some embodiments, the administration device 106 may receive data indicative of the positions of the blocks relative to one another (e.g., for display of the visual representation of the model 110). Further, in some embodiments, the communication module 306 may transmit the model data and/or other data to a remote compute device 108 (e.g., another model compute system).

Figure 4:
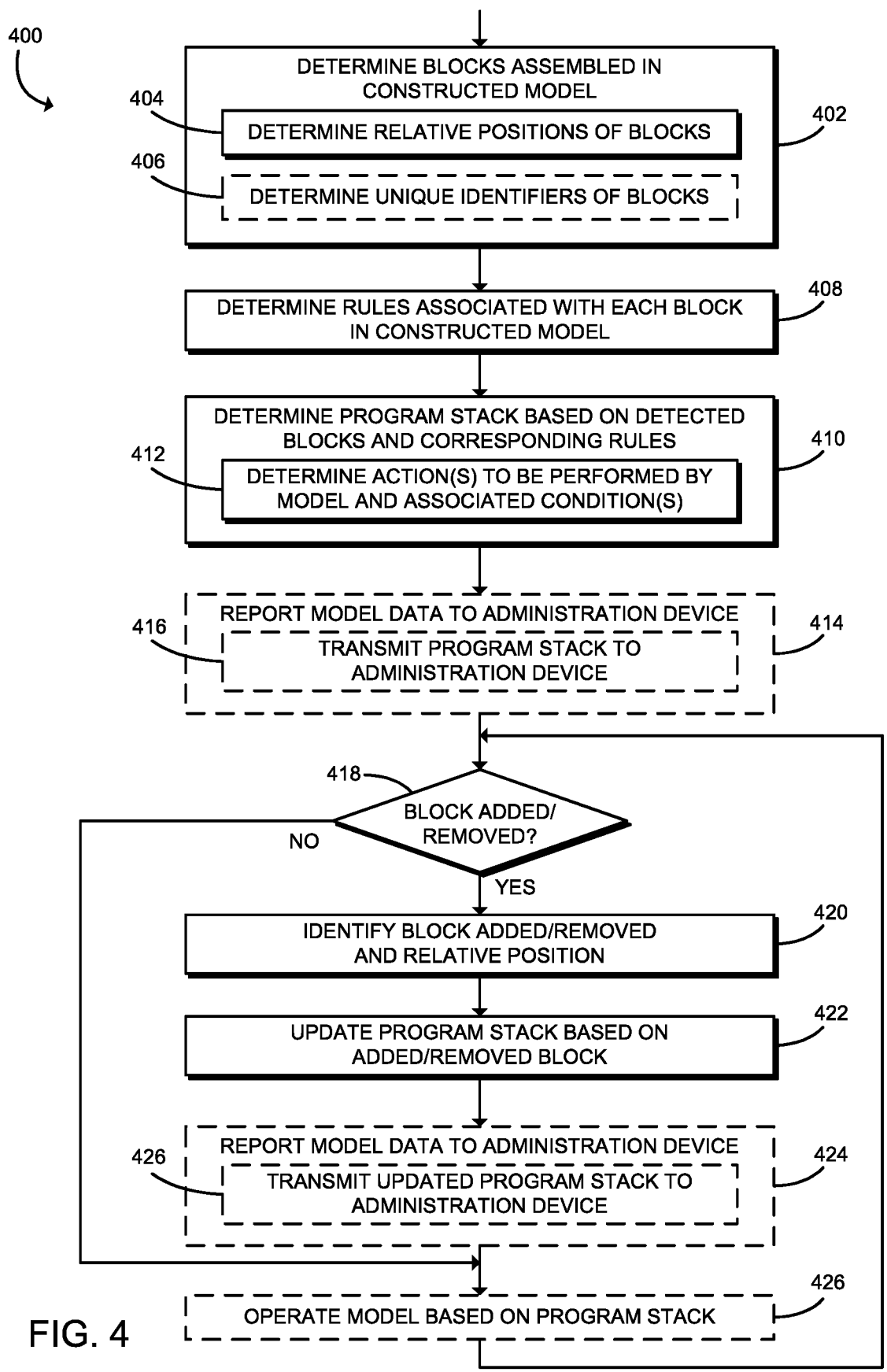
FIG. 4 is a simplified flow diagram of at least one embodiment of a method for physical programming that may be executed by the model compute system of FIG. 2.

Referring now to FIG. 4, in use, the model compute system 102 may execute a method 400 for physical programming. The illustrative method 400 begins with block 402 in which the model compute system 102 determines which construction blocks are assembled in a constructed model 110 associated with the model compute system 102. In doing so, in block 404, the model compute system 102 may determine the positions of the construction blocks of the model 110 relative to one another. Further, in block 406, the model compute system 102 may determine the unique identifiers associated with the blocks. Of course, the model compute system 102 may determine which blocks are assembled in the model 110 and/or determine their relative positions using any suitable techniques, algorithms, and/or mechanisms. For example, in some embodiments, the model compute system 102 may identify physical connections (e.g., electrical connections) between various blocks of the model 110 based on compute systems within one or more of the blocks that detect and report the connections as described above. In other embodiments, the model compute system 102 may utilize sensor data generated from the sensors 128 of the model compute system 102 and/or external sensors (e.g., cameras) to identify the blocks and/or their relative positions (e.g., via unique identifiers of the blocks).

In block 408, the model compute system 102 determines the rules associated with the blocks in the assembled model 110. As described above, each of the blocks may be associated with one or more rules that define behaviors (e.g., actions, functions, correlations, parameters, etc.) of the model 110 and those behaviors may vary depending on the particular circumstances. For example, the behavior may vary depending on the presence of (or lack of) one or more other blocks in the model 110, how the block is positioned relative to other blocks (e.g., whether it is in a particular sequence), whether the behavior is overridden by another block, inherited behaviors from other blocks, contextual data/events (e.g., the location of the model 110, whether other models 110 are within the vicinity, etc.), and/or other factors. As indicated above, the model compute system 102 may include a rules database 214 that defines the rule(s) corresponding with a particular block.

In block 410, the model compute system 102 generates or determines a program stack 212 for execution by the model compute system 102 based on the detected blocks and the corresponding rules. In doing so, in block 412, the model compute system 102 may determine the action(s) to be performed by the model 110 and any associated conditions (i.e., to be satisfied in order for the action to occur). In other words, in some embodiments, the program stack 212 may be indicative of an action sequence to be performed by the model 110.

In block 414, the model compute system 102 may report model data indicative of the program stack to the administration device 106. In particular, in block 416, the model compute system 102 may transmit the generated/determined program stack 212 to the administration device 106. Additionally, the model data may include data indicative of the physical attributes and relationships of the assembled model 110 (e.g., the manner/orientation by which the various blocks of the model 110 are connected to one another, etc.). As described herein, the administration device 106 may utilize the model data to generate a visual representation of the program stack 212 and/or the constructed model 110 for display on a graphical user interface of the administration device 106.

In block 418, the model compute system 102 determines whether a block has been added or removed from the constructed (i.e., fully or partially) model 110. If so, in block 420, the model compute system 102 identifies which block has been added to or removed from the model 110 and determines the position of that block relative to the other blocks of the model 110. In block 422, the model compute system 102 updates the program stack 212 based on the addition or removal of the block. In doing so, the model compute system 102 may determine the extent to which the addition or removal of the block affects the rules of the other blocks in the model 110. For example, the addition or removal of a particular block may change a particular physical programming sequence of blocks necessary to effect a particular behavior of the model 110.

In block 424, the model compute system 102 may report the model data indicative of the program stack 212 (or change to the program stack 212) to the administration device 106. In doing so, in block 426, the model compute system 102 may transmit the updated program stack 212 to the administration device 106. Of course, in other embodiments, the model compute system 102 may otherwise notify the administration device 106 of the changes to the model 110 and/or changes to the corresponding program stack 212.

In block 426, the model compute system 102 may operate the model 110 based on the program stack 212. Similarly, if the model compute system 102 determines in block 418 that a block has not been added or removed from the model 110, the method 400 advances to block 426 in which the model compute system 102 may operate the model 110 based on the program stack 212. As indicated above, the model compute system 102 may determine to operate the model 110 in response to the occurrence of some action (e.g., in response to the user of the model 110 depressing a particular button), in response to the satisfaction of some condition (e.g., in response to receiving a message from another model 110, in response to determining the model 110 is at a particular location, or in response to other contextual criteria), and/or in another suitable way. The method 400 returns to block 418 in which the model compute system 102 determines whether a block has been added to or removed from the model 110. In other words, the user may add and remove blocks to the model 110, and the model compute system 102 may continuously or periodically determine/generate an updated program stack 212 based on the rules/behaviors of the blocks present in the model 110 at a given point in time.

Figure 5:
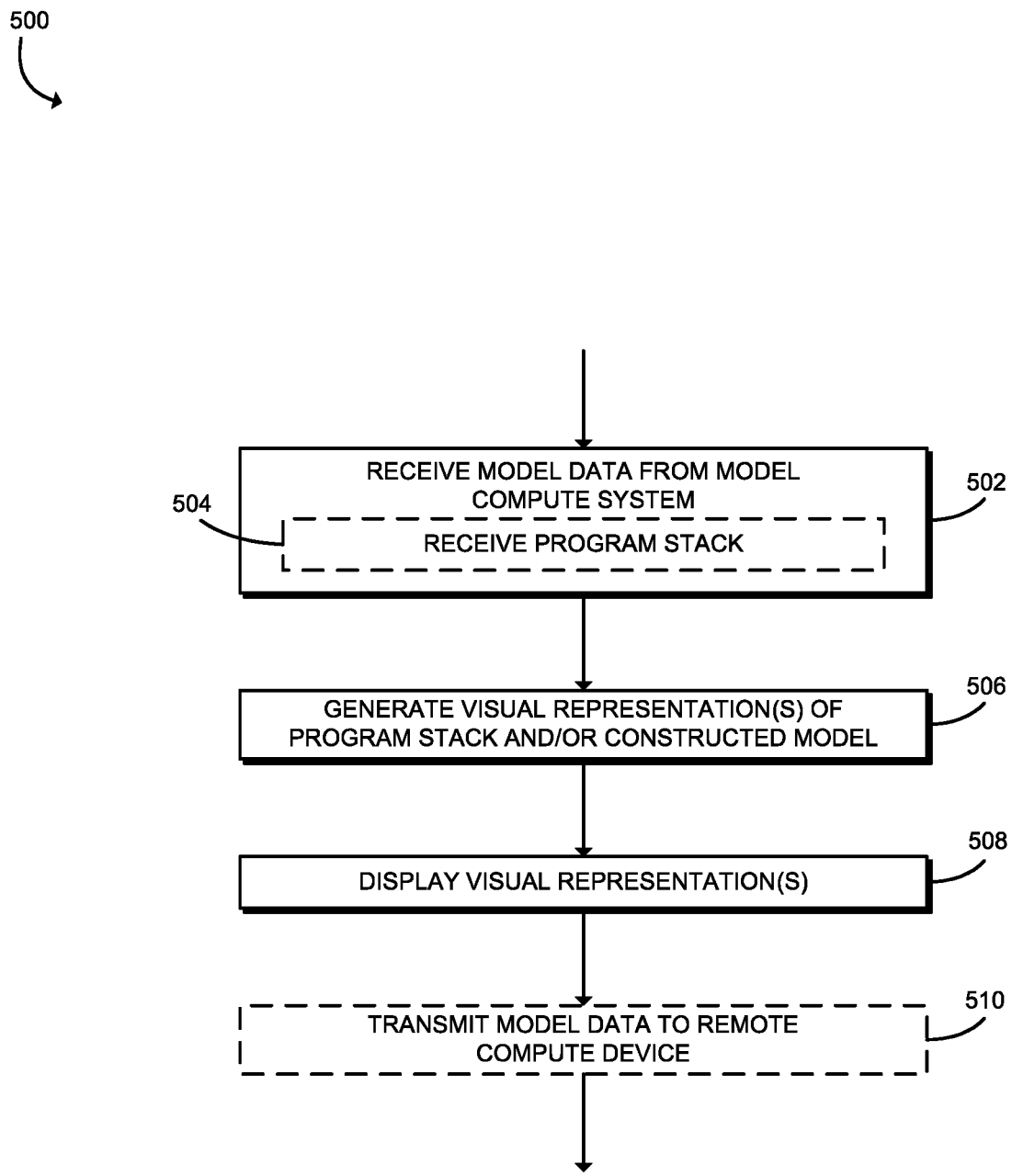
FIG. 5 is a simplified flow diagram of at least one embodiment of a method for visually representing physical programming that may be executed by the administration system of FIG. 3.

Referring now to FIG. 5, in use, the administration device 106 may execute a method 500 for visually representing physical programming. The illustrative method 500 begins with block 502 in which the administration device 106 receives model data from the model compute system 102. As discussed above, in block 504, the administration device 106 may receive the program stack 212 from the model compute system 102. Further, in some embodiments, the model data may include data indicative of the physical attributes and relationships of the assembled model 110 (e.g., the manner/orientation by which the various blocks of the model 110 are connected to one another, etc.).

In block 504, the administration device 106 generates a visual representation of the program stack 212 and/or the constructed model 110 and, in block 508, the administration device 106 displays the visual representation(s) in a graphical user interface on the display 162 of the administration device 106. In some embodiments, the visual representation of the model 110 and the corresponding program stack 212 resulting from the particular assembly of the blocks in the model 110 may be displayed simultaneously. Further, in some embodiments, the visual representations may change dynamically with the user's modification of the model 110 such that the user can see how changes to the model 110 affects the physical programming program stack 212. And, in some embodiments, the administration device 106 may virtually execute the program stack 212 and show the resulting behavior of the model 110 in the graphical user interface by virtue of the visual representation of the model 110.

In block 510, the administration device 106 may transmit the model data, or a portion thereof, to a remote compute device/system 108. For example, the model data may be transmitted to another model compute system 102. Further, in some embodiments, multiple models 110 within the vicinity of one another may be communicatively coupled and linked in a way that changes to one model 110 may affect the program stack 212 of the other model 110 or such that the two models 110 collaboratively utilize a single program stack 212. That is, in some embodiments, the program stack 212 may affect the behavior of multiple models 110. It should be appreciated that remote models 110 may be similarly linked through, for example, a cloud server (e.g., such that friends could play remotely and influence each other's model).

It should be appreciated that the techniques described herein permit the user to add function to a model 110 as an integral part of the model build/assembly process (i.e., through "physical" programming). As such, depending on the particular blocks used in a model 110 and the corresponding rules, the user may build models 110 having a wide array of capabilities. For example, in some embodiments, the model 110 may utilize a microphone and speaker to permit the user to talk to a character model 110 (e.g., of a superhero) and have the model 110 repeat the words spoken by the user in the voice of the character. In another embodiment, the model 110 may utilize proximity sensing and voice output to permit models 110 to communicate with one another when they are nearby one another (e.g., in character-based voices). In yet another embodiment, weather sensors may be utilized to report the temperature, humidity, and/or other environmental parameters to allow the model 110 to serve as a rudimentary weather station. In other embodiments, models 110 may include proximity sensors, electroluminescent displays, and/or other sensors 128 to permit users to communicate with one another using the models 110 via text and/or audio. Further, in some embodiments, the model compute system 102 may capture images with a camera and analyze the captured image to determine whether the model 110 is nearby another object (e.g., by detecting that object in the field of view of the camera). Of course, other combinations of sensors 128 and/or output devices 130 may be utilized for myriad other implementations of the techniques described herein.

EXAMPLES

Illustrative examples of the technologies disclosed herein are provided below. An embodiment of the technologies may include any one or more, and any combination of, the examples described below.

Example 1 includes a model compute system for physical programming, the model compute system comprising a block detection module to determine one or more physical blocks assembled in a constructed model; a model coordination module to (i) determine rules associated with the one or more physical blocks, wherein at least one rule defines a behavior of the constructed model, and (ii) determine a program stack for execution by the model compute system based on the rules associated with the one or more physical blocks.

Example 2 includes the subject matter of Example 1, and wherein the block detection module includes one or more sub-circuits distributed among the one or more physical blocks.

Example 3 includes the subject matter of any of Examples 1 and 2, and wherein to determine the one or more physical blocks assembled in the constructed model comprises to determine a position of the one or more physical blocks relative to at least one other physical block.

Example 4 includes the subject matter of any of Examples 1-3, and wherein to determine the one or more physical blocks assembled in the constructed model comprises to determine a unique identifier of each block of the one or more physical blocks.

Example 5 includes the subject matter of any of Examples 1-4, and wherein to determine the one or more physical blocks assembled in the constructed model comprises to determine physical connections between the one or more physical blocks based on self-reported connections of physical blocks indicative of connections to other physical blocks.

Example 6 includes the subject matter of any of Examples 1-5, and wherein to determine the program stack for execution by the model compute system comprises to determine an action to be performed by the constructed model.

Example 7 includes the subject matter of any of Examples 1-6, and further including a context module to determine whether the constructed model is within a vicinity of another model; and wherein to determine the action to be performed by the constructed model comprises to (i) determine a first action to be performed in response to a determination that the constructed model is within the vicinity of the another model and (ii) determine a second action to be performed in response to a determination that the constructed model is not within the vicinity of the another model.

Example 8 includes the subject matter of any of Examples 1-7, and wherein to determine the one or more physical blocks assembled in the constructed model comprises to determine an order in which the one or more physical blocks are assembled to one another; and wherein to determine the program stack for execution by the model comprises to determine a program to be executed by the model compute system based on the order.

Example 9 includes the subject matter of any of Examples 1-8, and wherein a first order of the one or more physical blocks is indicative of a first behavior of the model and a second order of the one or more physical blocks is indicative of a second behavior of the model.

Example 10 includes the subject matter of any of Examples 1-9, and wherein to determine the rules associated with the one or more physical blocks comprises to determine a rule indicative of a first block that indicates a behavior corresponding with a second block is to be overridden.

Example 11 includes the subject matter of any of Examples 1-10, and wherein the program stack is indicative of a plurality of behaviors to be performed at least one of sequentially or concurrently by the constructed model and another model communicatively coupled to the constructed model.

Example 12 includes the subject matter of any of Examples 1-11, and wherein the model coordination model is further to identify a block of the one or more physical blocks removed from the constructed model; and update the program stack based on the removed block.

Example 13 includes the subject matter of any of Examples 1-12, and wherein the model coordination model is further to identify another block assembled to the constructed model; and update the program stack based on the assembled another block.

Example 14 includes the subject matter of any of Examples 1-13, and further including a communication module to report model data indicative of the program stack to an administration device.

Example 15 includes the subject matter of any of Examples 1-14, and further including an execution module to operate the constructed model based on the program stack.

Example 16 includes a method of physical programming, the method comprising determining, by a model compute system, one or more physical blocks assembled in a constructed model; determining, by the model compute system, rules associated with the one or more physical blocks, wherein at least one rule defines a behavior of the constructed model; and determining, by the model compute system, a program stack for execution by the model compute system based on the rules associated with the one or more physical blocks.

Example 17 includes the subject matter of Example 16, and wherein determining the one or more physical blocks assembled in the constructed model comprises determining a position of the one or more physical blocks relative to at least one other physical block.

Example 18 includes the subject matter of any of Examples 16 and 17, and wherein determining the one or more physical blocks assembled in the constructed model comprises determining a unique identifier of each block of the one or more physical blocks.

Example 19 includes the subject matter of any of Examples 16-18, and wherein determining the one or more physical blocks assembled in the constructed model comprises determining physical connections between the one or more physical blocks based on self-reported connections of physical blocks indicative of connections to other physical blocks.

Example 20 includes the subject matter of any of Examples 16-19, and wherein determining the program stack for execution by the model comprises determining an action to be performed by the model.

Example 21 includes the subject matter of any of Examples 16-20, and further including determining, by the model compute system, whether the constructed model is within a vicinity of another model; wherein determining the action to be performed by the constructed model comprises (i) determining a first action to be performed in response to determining that the constructed model is within the vicinity of the another model and (ii) determining a second action to be performed in response to determining that the constructed model is not within the vicinity of the another model.

Example 22 includes the subject matter of any of Examples 16-21, and wherein determining the one or more physical blocks assembled in the constructed model comprises determining an order in which the one or more physical blocks are assembled to one another; and wherein determining the program stack for execution by the model comprises determining a program to be executed by the model compute system based on the order.

Example 23 includes the subject matter of any of Examples 16-22, and wherein a first order of the one or more physical blocks is indicative of a first behavior of the model and a second order of the one or more physical blocks is indicative of a second behavior of the model.

Example 24 includes the subject matter of any of Examples 16-23, and wherein determining the rules associated with the one or more physical blocks comprises determining a rule indicative of a first block that indicates a behavior corresponding with a second block is to be overridden.

Example 25 includes the subject matter of any of Examples 16-24, and wherein the program stack is indicative of a plurality of behaviors to be performed at least one of sequentially or concurrently by the constructed model and another model communicatively coupled to the constructed model.

Example 26 includes the subject matter of any of Examples 16-25, and further including identifying, by the model compute system, a block of the one or more physical blocks removed from the constructed model; and updating, by the model compute system, the program stack based on the removed block.

Example 27 includes the subject matter of any of Examples 16-26, and further including identifying, by the model compute system, another block assembled to the constructed model; and updating, by the model compute system, the program stack based on the assembled another block.

Example 28 includes the subject matter of any of Examples 16-27, and further including reporting, by the model compute system, model data indicative of the program stack to an administration device.

Example 29 includes the subject matter of any of Examples 16-28, and further including operating, by the model compute system, the constructed model based on the program stack.

Example 30 includes a compute device comprising a processor; and a memory having stored therein a plurality of instructions that when executed by the processor cause the compute device to perform the method of any of Examples 16-29.

Example 31 includes one or more machine-readable storage media comprising a plurality of instructions stored thereon that in response to being executed result in a compute device performing the method of any of Examples 16-29.

Example 32 includes a compute device comprising means for performing the method of any of Examples 16-29.

Example 33 includes a model compute system for physical programming, the model compute system comprising means for determining one or more physical blocks assembled in a constructed model; means for determining rules associated with the one or more physical blocks, wherein at least one rule defines a behavior of the constructed model; and means for determining a program stack for execution by the model compute system based on the rules associated with the one or more physical blocks.

Example 34 includes the subject matter of Example 33, and wherein the means for determining the one or more physical blocks assembled in the constructed model comprises means for determining a position of the one or more physical blocks relative to at least one other physical block.

Example 35 includes the subject matter of any of Examples 33 and 34, and wherein the means for determining the one or more physical blocks assembled in the constructed model comprises means for determining a unique identifier of each block of the one or more physical blocks.

Example 36 includes the subject matter of any of Examples 33-35, and wherein the means for determining the one or more physical blocks assembled in the constructed model comprises means for determining physical connections between the one or more physical blocks based on self-reported connections of physical blocks indicative of connections to other physical blocks.

Example 37 includes the subject matter of any of Examples 33-36, and wherein the means for determining the program stack for execution by the model comprises means for determining an action to be performed by the model.

Example 38 includes the subject matter of any of Examples 33-37, and further including means for determining whether the constructed model is within a vicinity of another model; wherein the means for determining the action to be performed by the constructed model comprises (i) means for determining a first action to be performed in response to determining that the constructed model is within the vicinity of the another model and (ii) means for determining a second action to be performed in response to determining that the constructed model is not within the vicinity of the another model.

Example 39 includes the subject matter of any of Examples 33-38, and wherein the means for determining the one or more physical blocks assembled in the constructed model comprises means for determining an order in which the one or more physical blocks are assembled to one another; and wherein the means for determining the program stack for execution by the model comprises means for determining a program to be executed by the model compute system based on the order.

Example 40 includes the subject matter of any of Examples 33-39, and wherein a first order of the one or more physical blocks is indicative of a first behavior of the model and a second order of the one or more physical blocks is indicative of a second behavior of the model.

Example 41 includes the subject matter of any of Examples 33-40, and wherein the means for determining the rules associated with the one or more physical blocks comprises means for determining a rule indicative of a first block that indicates a behavior corresponding with a second block is to be overridden.

Example 42 includes the subject matter of any of Examples 33-41, and wherein the program stack is indicative of a plurality of behaviors to be performed at least one of sequentially or concurrently by the constructed model and another model communicatively coupled to the constructed model.

Example 43 includes the subject matter of any of Examples 33-42, and further including means for identifying a block of the one or more physical blocks removed from the constructed model; and means for updating the program stack based on the removed block.

Example 44 includes the subject matter of any of Examples 33-43, and further including means for identifying another block assembled to the constructed model; and means for updating the program stack based on the assembled another block.

Example 45 includes the subject matter of any of Examples 33-44, and, further including means for reporting model data indicative of the program stack to an administration device.

Example 46 includes the subject matter of any of Examples 33-45, and further including means for operating the constructed model based on the program stack.

Example 47 includes an administration device for visually representing physical programming, the administration device comprising a display; a communication module to receive model data from a model compute system indicative of a desired behavior of a model constructed of physical blocks; a user interface module to generate a visual representation of a program stack for execution by the model compute system based on the model data; and a display module to display the visual representation of the program stack on the display.

Example 48 includes the subject matter of Example 47, and wherein to receive the model data comprises to receive the program stack.

Example 49 includes the subject matter of any of Examples 47 and 48, and wherein the communication module is further to transmit the model data to a remote compute device.

Example 50 includes the subject matter of any of Examples 47-49, and wherein the user interface module is further to generate a visual representation of the constructed model; and wherein the display module is further to display the visual representation of the constructed model on the display.

Example 51 includes a method of visually representing physical programming, the method comprising receiving, by an administration device, model data from a model compute system indicative of a desired behavior of a model constructed of physical blocks; generating, by the administration device, a visual representation of a program stack for execution by the model compute system based on the model data; and displaying, by the administration device, the visual representation of the program stack on a display of the administration device.

Example 52 includes the subject matter of Example 51, and wherein receiving the model data comprises receiving the program stack.

Example 53 includes the subject matter of any of Examples 51 and 52, and further including transmitting, by the administration device, the model data to a remote compute device.

Example 54 includes the subject matter of any of Examples 51-53, and further including generating, by the administration device, a visual representation of the constructed model; and displaying, by the administration device, the visual representation of the constructed model on the display.

Example 55 includes a compute device comprising a processor; and a memory having stored therein a plurality of instructions that when executed by the processor cause the compute device to perform the method of any of Examples 51-54.

Example 56 includes one or more machine-readable storage media comprising a plurality of instructions stored thereon that in response to being executed result in a compute device performing the method of any of Examples 51-54.

Example 57 includes a compute device comprising means for performing the method of any of Examples 51-54.

Example 58 includes an administration device for visually representing physical programming, the administration device comprising means for receiving model data from a model compute system indicative of a desired behavior of a model constructed of physical blocks; means for generating a visual representation of a program stack for execution by the model compute system based on the model data; and means for displaying the visual representation of the program stack on a display of the administration device.

Example 59 includes the subject matter of Example 58, and wherein the means for receiving the model data comprises means for receiving the program stack.

Example 60 includes the subject matter of any of Examples 58 and 59, and further including means for transmitting the model data to a remote compute device.

Example 61 includes the subject matter of any of Examples 58-60, and further including means for generating a visual representation of the constructed model; and means for displaying the visual representation of the constructed model on the display.

The invention claimed is:

1. A model compute system for physical programming, the model compute system comprising:
   a block detection circuitry to determine one or more physical blocks assembled in a constructed model;
   a model coordination circuitry to (i) determine rules associated with the one or more physical blocks, wherein at least one rule defines a behavior of the constructed model, and (ii) determine a program stack for execution by the model compute system based on the rules associated with the one or more physical blocks, wherein to determine the program stack comprises to determine one or more actions in the program stack to be performed by the constructed model based on the rules associated with the one or more physical blocks; and
   a context circuitry to determine whether the constructed model is within a vicinity of another model, wherein to determine the action to be performed by the constructed model comprises to (i) determine a first action to be performed in response to a determination that the constructed model is within the vicinity of the another model and (ii) determine a second action to be performed in response to a determination that the constructed model is not within the vicinity of the another model.

2. The model compute system of claim 1, wherein the block detection circuitry includes one or more sub-circuits distributed among the one or more physical blocks.

3. The model compute system of claim 1, wherein to determine the one or more physical blocks assembled in the constructed model comprises to determine a position of the one or more physical blocks relative to at least one other physical block.

4. The model compute system of claim 1, wherein to determine the one or more physical blocks assembled in the constructed model comprises to determine a unique identifier of each block of the one or more physical blocks.

5. The model compute system of claim 1, wherein to determine the one or more physical blocks assembled in the constructed model comprises to determine physical connections between the one or more physical blocks based on self-reported connections of physical blocks indicative of connections to other physical blocks.

6. The model compute system of claim 1, wherein to determine the one or more physical blocks assembled in the constructed model comprises to determine an order in which the one or more physical blocks are assembled to one another; and
wherein to determine the program stack for execution by the model comprises to determine a program to be executed by the model compute system based on the order.

7. The model compute system of claim 6, wherein a first order of the one or more physical blocks is indicative of a first behavior of the model and a second order of the one or more physical blocks is indicative of a second behavior of the model.

8. The model compute system of claim 1, wherein the program stack is indicative of a plurality of behaviors to be performed at least one of sequentially or concurrently by the constructed model and another model communicatively coupled to the constructed model.

9. The model compute system of claim 1, wherein the model coordination model is further to:
identify a block of the one or more physical blocks removed from the constructed model; and
update the program stack based on the removed block.

10. The model compute system of claim 1, wherein the model coordination model is further to:
identify another block assembled to the constructed model; and
update the program stack based on the assembled another block.

11. One or more non-transitory, machine-readable storage media comprising a plurality of instructions stored thereon that, in response to execution by a model compute system, cause the model compute system to:
determine one or more physical blocks assembled in a constructed model;
determine rules associated with the one or more physical blocks, wherein at least one rule defines a behavior of the constructed model;
determine a program stack for execution by the model compute system based on the rules associated with the one or more physical blocks, wherein to determine the program stack comprises to determine one or more actions in the program stack to be performed by the constructed model based on the rules associated with the one or more physical blocks; and
determine whether the constructed model is within a vicinity of another model, wherein to determine the action to be performed by the constructed model comprises to (i) determine a first action to be performed in response to a determination that the constructed model is within the vicinity of the another model and (ii) determine a second action to be performed in response to a determination that the constructed model is not within the vicinity of the another model.

12. The one or more non-transitory, machine-readable storage media of claim 11, wherein to determine the one or more physical blocks assembled in the constructed model comprises to determine a position of the one or more physical blocks relative to at least one other physical block.

13. The one or more non-transitory, machine-readable storage media of claim 11, wherein to determine the one or more physical blocks assembled in the constructed model comprises to determine an order in which the one or more physical blocks are assembled to one another; and
wherein to determine the program stack for execution by the model comprises to determine a program to be executed by the model compute system based on the order.

14. The one or more non-transitory, machine-readable storage media of claim 11, wherein to determine the rules associated with the one or more physical blocks comprises to determine a rule indicative of a first block that indicates a behavior corresponding with a second block is to be overridden.

15. The one or more non-transitory, machine-readable storage media of claim 11, wherein the plurality of instructions further cause the model compute system to report model data indicative of the program stack to an administration device.

16. The one or more non-transitory, machine-readable storage media of claim 11, wherein the plurality of instructions further cause the model compute system to operate the constructed model based on the program stack.

17. A method of physical programming, the method comprising:
determining, by a model compute system, one or more physical blocks assembled in a constructed model;
determining, by the model compute system, rules associated with the one or more physical blocks, wherein at least one rule defines a behavior of the constructed model;
determining, by the model compute system, a program stack for execution by the model compute system based on the rules associated with the one or more physical blocks, wherein determining the program stack comprises determining one or more actions in the program stack to be performed by the constructed model based on the rules associated with the one or more physical blocks; and
determining whether the constructed model is within a vicinity of another model, determining the action to be performed by the constructed model comprises (i) determine a first action to be performed in response to a determination that the constructed model is within the vicinity of the another model and (ii) determining a second action to be performed in response to a determination that the constructed model is not within the vicinity of the another model.

18. The method of claim 17, wherein determining the one or more physical blocks assembled in the constructed model comprises determining a position of the one or more physical blocks relative to at least one other physical block.

19. The method of claim 17, wherein determining the one or more physical blocks assembled in the constructed model comprises determining an order in which the one or more physical blocks are assembled to one another; and wherein determining the program stack for execution by the model comprises determining a program to be executed by the model compute system based on the order.

20. One or more non-transitory, machine-readable storage media comprising a plurality of instructions stored thereon that, in response to execution by an administration device for visually representing physical programming, cause the administration device to:

receive model data from a model compute system indicative of a desired behavior of a model constructed of physical blocks;

generate a visual representation of a program stack for execution by the model compute system based on the model data, wherein the visual representation of the programming stack reflects programming instructions from how the physical blocks are physically oriented with respect to each other; and display the visual representation of the program stack on a display.

21. The one or more non-transitory, machine-readable storage media of claim 20, wherein to receive the model data comprises to receive the program stack.

22. The one or more non-transitory, machine-readable storage media of claim 20, wherein the plurality of instructions further cause the administration device to transmit the model data to a remote compute device.

23. The one or more non-transitory, machine-readable storage media of claim 20, wherein the plurality of instructions further cause the administration device to generate a visual representation of the constructed model; and wherein the plurality of instructions further cause the administration device to display the visual representation of the constructed model on the display.

24. A model compute system for physical programming, the model compute system comprising:

one or more processors; and one or more memory devices comprising a plurality of instructions stored thereon that, in response to execution by the one or more processors, cause the model compute system to:

determine one or more physical blocks assembled in a constructed model;

determine rules associated with the one or more physical blocks, wherein at least one rule defines a behavior of the constructed model;

determine a program stack for execution by the model compute system based on the rules associated with the one or more physical blocks, wherein to determine the program stack comprises to determine one or more actions in the program stack to be performed by the constructed model based on the rules associated with the one or more physical blocks; and determine whether the constructed model is within a vicinity of another model, determining the action to be performed by the constructed model comprises to (i) determine a first action to be performed in response to a determination that the constructed model is within the vicinity of the another model and (ii) determine a second action to be performed in response to a determination that the constructed model is not within the vicinity of the another model.

25. The model compute system of claim 24, wherein to determine the one or more physical blocks assembled in the constructed model comprises to determine a position of the one or more physical blocks relative to at least one other physical block.

* * * * *